United States Patent
Aichinger et al.

(10) Patent No.: US 11,417,747 B2
(45) Date of Patent: Aug. 16, 2022

(54) TRANSISTOR DEVICE WITH A VARYING GATE RUNNER RESISTIVITY PER AREA

(71) Applicant: Infineon Technologies AG, Neubiberg (DE)

(72) Inventors: Thomas Aichinger, Faak am See (AT); Wolfgang Bergner, Klagenfurt (AT); Ralf Siemieniec, Villach (AT); Frank Wolter, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 18 days.

(21) Appl. No.: 17/072,602

(22) Filed: Oct. 16, 2020

(65) Prior Publication Data
US 2021/0119006 A1    Apr. 22, 2021

(30) Foreign Application Priority Data
Oct. 17, 2019    (DE) ..................... 10 2019 128 072.9

(51) Int. Cl.
| H01L 29/10 | (2006.01) |
| H01L 29/16 | (2006.01) |
| H01L 29/43 | (2006.01) |
| H01L 29/423 | (2006.01) |

(52) U.S. Cl.
CPC ........ H01L 29/435 (2013.01); H01L 29/1033 (2013.01); H01L 29/1095 (2013.01); H01L 29/1608 (2013.01); H01L 29/4236 (2013.01)

(58) Field of Classification Search
CPC ............... H01L 29/435; H01L 29/1033; H01L 29/1095; H01L 29/1608; H01L 29/4236; H01L 29/41766; H01L 29/0696; H01L 29/7803; H01L 29/7813; H01L 29/4238
USPC ......................................................... 257/364
See application file for complete search history.

(56) References Cited

U.S. PATENT DOCUMENTS

| 2009/0184373 A1* | 7/2009 | Kaindl ................ H01L 29/7811 257/364 |
| 2019/0267487 A1* | 8/2019 | Laforet ................ H01L 29/407 |
| 2021/0118992 A1* | 4/2021 | Melzner ............ H01L 29/66348 |

FOREIGN PATENT DOCUMENTS

JP    2011134984 A    7/2011

* cited by examiner

*Primary Examiner* — Fazli Erdem
(74) *Attorney, Agent, or Firm* — Cooper Legal Group LLC

(57) ABSTRACT

In an example, a transistor device is provided. The transistor device includes a plurality of transistor cells each including a gate electrode and each at least partially integrated in a semiconductor body that includes a wide bandgap semiconductor material. The transistor device includes a gate pad arranged on top of the semiconductor body, and a plurality of gate runners each arranged on top of the semiconductor body and each connected to gate electrodes of at least some of the plurality of transistor cells. Each gate runner of the plurality of gate runners has a longitudinal direction, and at least one of the gate runners includes at least a section in which a resistivity per area increases in the longitudinal direction as a distance to the gate pad along the gate runner increases.

20 Claims, 11 Drawing Sheets

TRANSISTOR DEVICE WITH A VARYING GATE RUNNER RESISTIVITY PER AREA

RELATED APPLICATION

This application claims priority to German Patent Application No. 102019128072.9, filed on Oct. 17, 2019, entitled "TRANSISTOR DEVICE WITH A VARYING GATE RUNNER RESISTIVITY PER AREA", which is incorporated by reference herein in its entirety.

SUMMARY

This disclosure relates in general to a transistor device, for example, a transistor device based on a wide bandgap semiconductor material.

Transistor devices are widely used as electronic switches in various kinds of electronic applications. Some types of transistor devices are voltage controlled devices that switch on and off dependent on a drive voltage received at a drive input. Examples of voltage controlled transistor devices include MOSFETs (Metal Oxide Semiconductor Field-Effect Transistors), JFETs (Junction Field-Effect Transistors), or the like.

Changing the switching state of a transistor device may cause a change of a load current through the transistor device such that the load current increases from zero when the transistor device switches on and decreases to zero when the transistor device switches off. The faster the transistor changes its switching state the higher may be a gradient of the load current. A changing load current may cause voltage spikes in parasitic inductances of a load connected to the transistor device and/or in parasitic inductances of connection lines connected between the transistor device, the load, and a voltage source. Basically, the higher the gradient of the load current, the higher a voltage level of the voltage spikes.

In order to avoid high voltage spikes that are associated with switching a transistor device there is a need for a transistor device with a soft switching behavior.

One example relates to a transistor device. The transistor device comprises a plurality of transistor cells, wherein each transistor cell of the plurality of transistor cells comprises a gate electrode and each transistor cell of the plurality of transistor cells is at least partially integrated in a semiconductor body that comprises a wide bandgap semiconductor material. The transistor device comprises a gate pad arranged on top of the semiconductor body. The transistor device comprises a plurality of gate runners, wherein each gate runner of the plurality of gate runners is arranged on top of the semiconductor body and each gate runner of the plurality of gate runners is connected to gate electrodes of at least some of the plurality of transistor cells. Each gate runner of the plurality of gate runners has a longitudinal direction. At least one gate runner of the plurality of gate runners comprises at least a section in which a resistivity per area increases in the longitudinal direction as a distance to the gate pad along the gate runner increases.

DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIG. 11 illustrates a modification of the transistor device shown in

FIG. 10;

DETAILED DESCRIPTION

In the following detailed description, reference is made to the accompanying drawings. The drawings form a part of the description and for the purpose of illustration show examples of how the present disclosure may be used and implemented. It is to be understood that the features of the various embodiments described herein may be combined with each other, unless specifically noted otherwise.

Figure 1:
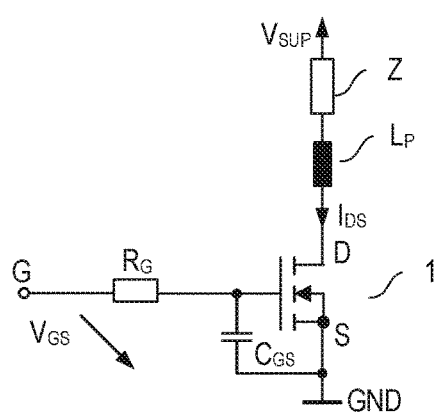
FIG. 1 illustrates one example of an electronic circuit that includes a transistor device as an electronic switch.

FIG. 1 illustrates an electronic circuit that includes a transistor device 1 and a load Z. The transistor 1 is used as an electronic switch for switching a load current $I_{DS}$ through the load Z and includes a drive input G-S configured to receive a drive voltage $V_{GS}$ and a load path D-S connected in series with the load Z. The series circuit including the load path D-S of the transistor device 1 and the load Z receives a supply voltage $V_{SUP}$ from a voltage source (not shown). The load Z may include any kind of electric load or load circuit.

For the purpose of illustration, the transistor device 1 shown in FIG. 1 is a MOSFET, such as an n-type enhancement MOSFET. The load path of this type of transistor device is an internal current path between a drain node D and a source node S of the transistor device. Further, the drive input is formed by a gate node G and the source node S (as illustrated in FIG. 1) or by an additional circuit node (not shown in FIG. 1). In this type of transistor device, the drive voltage $V_{GS}$ may also be referred to as gate-source voltage. However, implementing the transistor device 1 as an n-type enhancement MOSFET is only an example. Other examples of the transistor device 1 include, an n-type depletion MOSFET, a p-type enhancement or depletion MOSFET, or the like.

The transistor device 1 switches on or off dependent on a voltage level of the drive voltage $V_{GS}$ received at the drive input. The transistor device 1 is in an on-state, in which it is capable of conducting a load current $I_{DS}$ different from zero, when the drive voltage $V_{GS}$ is higher than a threshold voltage of the transistor device 1. Further, the transistor device 1 is in an off-state, in which it is capable of blocking the drain voltage $V_{DS}$, when the drive voltage $V_{GS}$ is below the threshold voltage. In an n-type enhancement MOSFET, for example, the threshold voltage is a positive voltage of between 1V and 5V, for example.

Dependent on the specific implementation of the transistor device 1, a voltage blocking capability of the transistor device 1 may be between several 10V and several kilovolts (kV), for example. The "voltage blocking capability" is the maximum voltage the transistor device can withstand between its load nodes D, S.

In the following, a voltage level of the drive voltage $V_{GS}$ that is higher than the threshold voltage of the transistor device 1 is referred to as on-level, and a voltage level of the drive voltage $V_{GS}$ lower than the threshold voltage is referred to as off-level. When the drive voltage $V_{GS}$ changes from the off-level to the on-level, or vice versa, there is usually a delay time before the transistor device 1 changes its switching state. That is, when the drive voltage $V_{GS}$ changes from the off-level to the on-level, for example, there is a delay time between the time instance when the voltage level of the drive voltage $V_{GS}$ changes and the time instance when the transistor device 1 switches from the off-state to the on-state. This time delay is due to an internal gate resistance $R_G$ and a gate-source capacitance $C_{GS}$. The internal gate resistance is a resistance between the gate node G and an internal gate node of the transistor device 1, and the internal gate-source capacitance a capacitance between the internal gate node and the source node S. The transistor device 1 is in the on-state, for example, when an internal gate-source voltage, which is the voltage across the gate-source capacitance $C_{GS}$, is higher than the threshold voltage. Thus, when the drive voltage $V_{GS}$ changes from the off-level to the on-level, the gate-source capacitance $C_{GS}$ has to be charged via the gate resistance $R_G$ before the transistor device 1 switches on. In some examples, the higher the gate resistance $R_{GS}$ and the higher the gate-source capacitance $C_{GS}$, the greater the delay time.

In some examples, the transistor device 1 has an on-resistance, which is the electrical resistance between the drain node D and the source node S in the on-state. This on-resistance is dependent on the internal gate-source voltage and, in a certain voltage range, decreases as the internal gate-source voltage increases. The on-resistance is relatively high when the internal gate-source voltage equals the threshold voltage and decreases as the internal gate-source voltage further increases. In some examples, the transistor device is driven such that the on-level of the drive voltage $V_{GS}$ is significantly higher than the threshold voltage of the transistor device 1.

The gate resistance $R_G$ and the gate-source capacitance $C_{GS}$ do not only affect the switching delay, which is the delay time between the time instance when the drive voltage $V_{GS}$ changes its voltage level and the time instance when the transistor device 1 changes its switching state, but the gate resistance $R_G$ and the gate-source capacitance $C_{GS}$ also affect the further increase of the internal gate-source voltage after the internal gate-source voltage has reached the threshold voltage. That is, besides other parameters such as a gate-drain capacitance $C_{GD}$ (not shown) of the transistor device, the gate resistance $R_G$ and the gate-source capacitance $C_{GS}$ also have an effect on how fast the on-resistance decreases when the transistor device 1 switches on. A gradient of the decreasing on-resistance when the transistor device switches on or a gradient of the increasing on-resistance when the transistor device switches off may be referred to as switching speed of the transistor device 1. The faster the on-resistance decreases, that is, the faster the transistor device 1 switches on, the faster the load current $I_{GS}$ increases and the higher the gradient of the load current $I_{DS}$. The changing load current $I_{DS}$ may result in voltage spikes across parasitic inductances in the electronic circuit. Parasitic inductances in the electronic circuit are represented by an inductor $L_P$ in the electronic circuit shown in FIG. 1. In some examples, the higher the gradient of the load current $I_{DS}$, the higher a voltage level of voltage spikes that may occur when the transistor device 1 changes its state.

Dependent on the specific implementation of the transistor device 1, the gate-source capacitance $C_{GS}$ may be relatively low. This may result in a high gradient of the decreasing on-resistance when the transistor device 1 changes its switching state and, therefore, in a high gradient of the load current $I_{DS}$. Wide bandgap semiconductor based transistor devices, such as silicon carbide (SiC) based transistor devices, for example, have a relatively low gate-source capacitance $C_{GS}$ as compared to silicon (Si) based transistor devices with the same voltage blocking capability and the same (minimum) on-resistance.

In various circuit applications high gradients of the load current $I_{DS}$ and, therefore, high voltage spikes across parasitic inductances are undesired. It is therefore desirable to provide a wide bandgap transistor device, such as an SiC based transistor device, with a soft switching behavior. "Soft switching behavior" includes that a gradient of the on-resistance is reduced, as compared to a conventional transistor device, when the transistor device changes its switching state.

Figure 2:
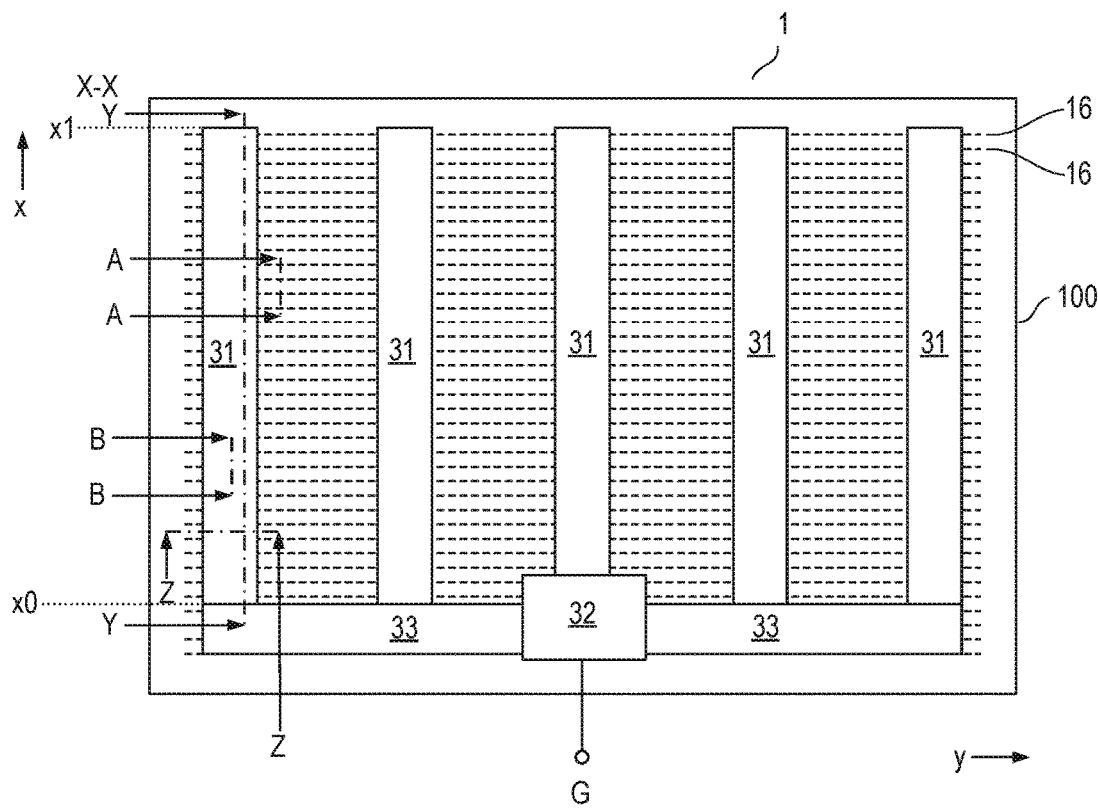
FIG. 2 shows a top view of a transistor device according to one example, wherein the transistor device includes a gate pad and a plurality of gate runners.

A top view of one example of a transistor device with a soft switching behavior is illustrated in FIG. 2. Referring to FIG. 2, the transistor device 1 includes a semiconductor body 100 and a plurality of transistor cells that are at least partially integrated in the semiconductor body 100. Examples of these transistor cells are explained in detail herein further below. Each of the transistor cells includes a gate electrode 16, wherein the gate electrodes are only schematically illustrated by dashed lines in the example shown in FIG. 2. Further, the transistor device 1 includes a plurality of gate runners 31 arranged on top of the semiconductor body 100, wherein each of these gate runners 31 is connected to the gate electrode 16 of at least some of the plurality of transistor cells. Further, each of the gate runners 31 is connected to a gate pad 32 arranged on top of the semiconductor body 100. The gate pad 31 forms the gate node G or is connected to the gate node G of the transistor device. The gate runners 31 may directly be connected to the gate pad 31 or may be connected to the gate pad 32 through a connection runner 33.

Referring to FIG. 2, each of the gate runners 31 has a longitudinal direction and a cross direction, wherein the cross direction is perpendicular to the longitudinal direction. A dimension of each gate runner 31 in the respective longitudinal direction is greater than the dimension in the respective cross direction. For the purpose of illustration, the gate runners 31 are essentially parallel to each other in the example shown in FIG. 2. Essentially parallel, as used herein, may correspond to parallel (such as where a difference between angles of two lines is zero) or about parallel (such as where a difference between angles of two lines is less than a threshold). In this example, longitudinal directions of the gate runners 31 correspond to a first horizontal direction x of the semiconductor body 100, and cross directions of the gate runners 31 correspond to a second horizontal direction y of the semiconductor body 100. These first and second horizontal directions x, y of the semiconductor body 100 are essentially parallel to a top surface of the semiconductor body 100 on which the gate runners 31 and the gate pad 32 are arranged. The gate electrodes 16 may be elongated gate electrodes that have a longitudinal direction corresponding to the second horizontal direction y. In this example, the longitudinal directions of the gate runners 31 and the longitudinal directions of the gate electrodes 16 are essentially perpendicular to each other. This, however, is only an example. Essentially perpendicular, as used herein, may correspond to perpendicular (such as where a difference between angles of two lines is 90 degrees) or about perpendicular (such as where a difference between angles of two lines is in a range that ranges from a minimum difference that is less than or equal to 90 degrees to a maximum difference that is greater than or equal to 90 degrees). Other examples are explained herein further below.

Figure 3:
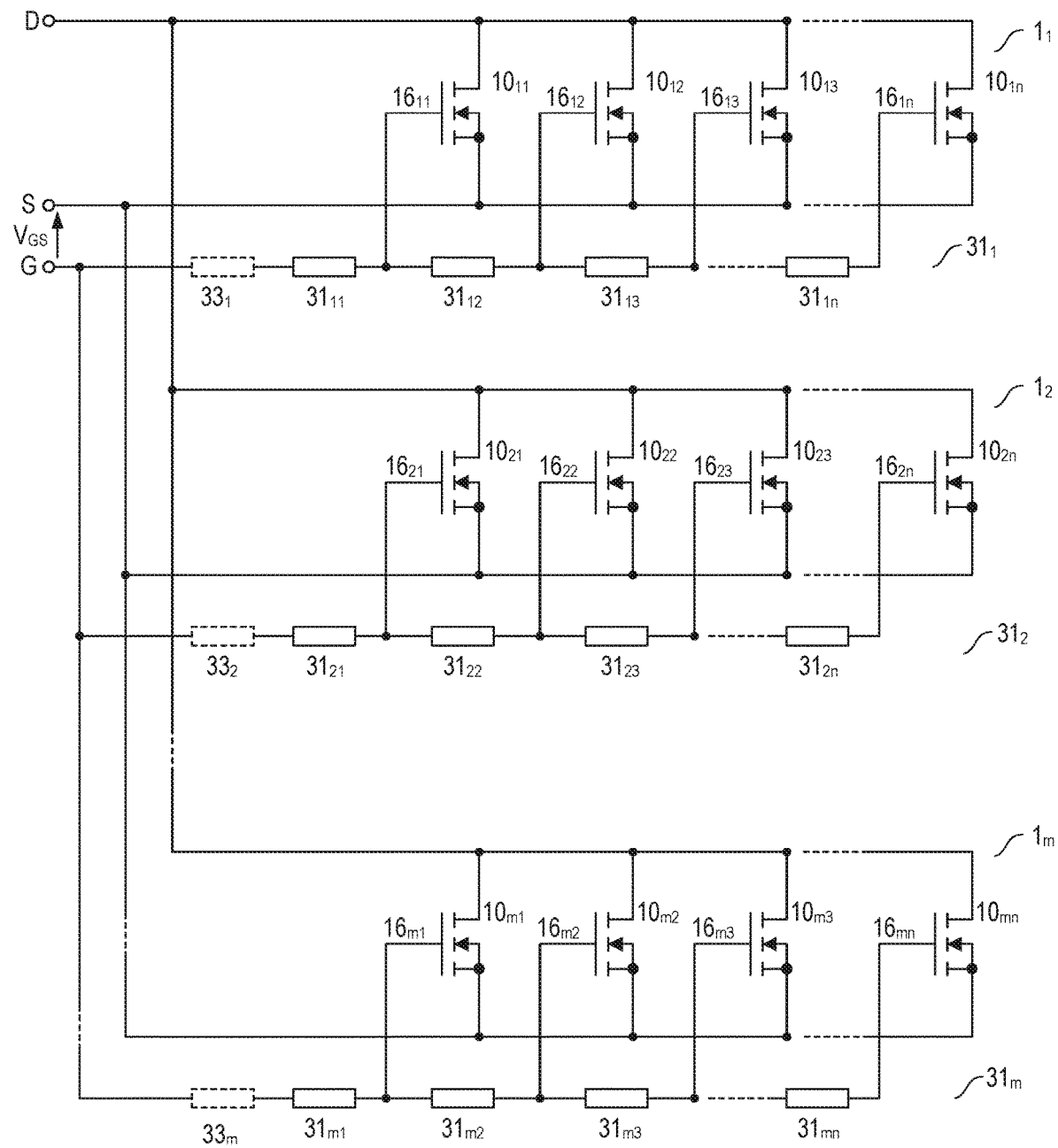
FIG. 3 illustrates an equivalent circuit diagram of the transistor device shown in FIG. 2.

FIG. 3 illustrates an equivalent circuit diagram of the transistor device shown in FIG. 2. For the purpose of illustration it is assumed that the transistor device includes m, wherein m≥2, gate runners 31 which are referred to as $31_1$, $31_2$, $31_m$ in FIG. 3. Further, it is assumed that each of these gate runners $31_1$, $31_2$, $31_m$ is connected to the gate electrodes 16 of transistor cells of a respective group of transistor cells. In FIG. 3, $1_1$ denotes the group of transistor cells connected to gate runner $31_1$, $1_2$ denotes to the group of transistor cells connected to gate runner $31_2$, and $1_m$ denotes the group of transistor cells connected to gate runner $31_m$. Further, reference numbers $10_{11}$-$10_{1n}$ denote the transistor cells included in the first group $1_1$, reference numbers $10_{21}$-$10_{2n}$ denote the transistor cells in group $1_2$, and reference numbers $10_{m1}$-$10_{mn}$ denotes the transistor cells in group $1_m$. The individual groups $1_1$-$1_m$ may have the same number of transistor cells or may have different numbers of transistor cells. In the following, reference number 10 denotes an arbitrary one or the plurality of transistor cells, when no differentiation between the individual transistor cells $10_{11}$-$10_{mn}$ is required. In FIG. 3, each of these transistor cells 10 is represented by the circuit symbol of a transistor. For the purpose of illustration, the transistor cells 10 are n-type enhancement MOSFET transistor cells in this example. This, however, is only an example. The transistor cells may be implemented in any other way as well.

Referring to FIG. 3, the transistor cells 10 are connected in parallel. That is, each of the transistor cells 10 has an internal drain node connected to the drain node D of the transistor device and each of the transistor cells 10 has an internal source node connected to the source node S of the transistor device. Further, internal gate nodes of the transistor cells 10 are connected to the gate node G of the transistor device through the respective gate runner 31 (wherein 31 denotes an arbitrary one or the plurality of gate runners $31_1$-$31_m$ shown in FIG. 3). That is, internal gate nodes of the transistor cells $1_{11}$-$1_{1n}$ of the first group $1_1$ are connected to the gate node G through gate runner $31_1$, transistor cells $1_{21}$-$1_{2n}$ of the second group $1_2$ are connected to the gate node G through gate runner $31_2$, and so on. The internal gate nodes of the transistor cells 10 are formed by the gate electrodes 16 (see FIG. 2) of the respective transistor cells, according to one example. These gate electrodes are referred to as $16_{11}$-$16_{mn}$ in the example shown in FIG. 3.

Each of the transistor cells 10 includes a gate-source capacitance (not shown in FIG. 3), wherein a respective transistor cell 10 switches on when the gate-source voltage of the respective transistor cell 10 becomes higher than the threshold voltage of the transistor cell. According to one example, the transistor cells 10 essentially have the same threshold voltage. For example, a threshold voltage of a transistor cell 10 may be the same as other threshold voltages of other transistor cells 10. Alternatively and/or additionally, a difference between a threshold voltage of a transistor cell 10 and other threshold voltages of other transistor cells 10 may be less than a threshold difference. According to another example, the transistor device includes at least two groups of transistor cells with different threshold voltages.

The process of switching on the transistor device 1 is explained with reference to the transistor cells $10_{11}$-$10_{1n}$ of the first group $1_1$ in the following, wherein this switching on process occurs in the transistor cells of the other groups $1_2$, $1_m$ equivalently. For the purpose of explanation it is assumed that the gate electrodes $16_{11}$-$16_{1n}$ of the individual transistor cells $1_{11}$-$1_{1n}$ are connected to the gate runner $31_1$ at different positions of the gate runner $31_1$ in the longitudinal direction of the gate runner $31_1$. Thus, distances, along the gate runner $31_1$ and the optional connection runner 33, between positions where the gate electrodes $16_{11}$-$16_{1n}$ of the individual transistor cells $1_{11}$-$1_n$ are connected to the gate runner $31_1$ and the gate pad 32 are different.

In some examples, the gate runner $31_1$ can be considered as a series circuit including a plurality of resistors $31_{11}$-$31_{1n}$ and a plurality of taps, wherein the gate electrode $16_{11}$-$16_{1n}$ of each of the transistor cells $10_{11}$-$10_{1n}$ is connected to a respective tap of the resistor series circuit. A first resistor $31_{11}$ of the series circuit represents a section of the gate runner $31_1$ between the gate pad 32 or the connection runner 33 and a position of a gate electrode $16_{11}$ of a first one $10_{11}$ of the transistor cells. A second resistor $31_{12}$ represents a section of the gate runner $31_1$ between the position at which the gate electrode $16_{11}$ of the first transistor cell $10_{11}$ is connected to the gate runner $31_1$ and a position at which a gate electrode $16_{12}$ of a second transistor cell $10_{12}$ of the first group $1_1$ is connected to the gate runner $31_1$. A third transistor $31_{13}$ represents a section of the gate runner $31_1$ between a position at which the gate electrode $16_{12}$ of the second transistor cell $I_{12}$ is connected to the gate runner $31_1$ and a position at which a gate electrode $16_{13}$ of a third transistor cell $10_{13}$ is connected to the gate runner $31_1$, and so on. Resistor $33_1$ connected between the gate node G and the first resistors $31_{11}$ represents the resistance of the optional connection runner 33.

In the transistor device shown in FIG. 3, the transistor cells $10_{11}$, $10_{1n}$ of the first group $1_1$ have different gate resistances, wherein the gate resistance of one transistor cell is given by the electrical resistance between the gate node G and the gate electrode 16 (wherein 16 denotes an arbitrary one of the plurality of gate electrodes) of the respective transistor cell 10. In the first group $1_1$, the first transistor cell $10_{11}$ has the lowest gate resistance and transistor cell $10_{1n}$ which is arranged most distant to the gate pad 31 along the gate runner $31_1$ has the highest gate resistance. Thus, when the drive voltage $V_{GS}$ changes from the off-level to the on-level, the gate-source voltage of the first transistor cell $10_{11}$ is the first one that reaches the threshold voltage, then the gate-source voltage of the second transistor cell $10_{12}$ reaches the threshold voltage, and so on. Thus, the first transistor cell $10_1$ is the first one that switches on, then the second transistor cell $10_{12}$ switches on, and so on. Thus, in a transistor device of the type shown in FIG. 2 there is inevitably a delay time between time instances when the individual transistor cells 10 switch on. This successive switching on of the individual transistor cells 10 has the effect that the on-resistance of the transistor device, which is given by a parallel circuit of the on-resistances of the individual transistor cells 10, gradually decreases.

In some types of transistor devices, such as in wide bandgap semiconductor based transistor devices, these delay times are rather short (e.g., shorter than a threshold delay time) and not sufficient in order to achieve a desired soft switching behavior. Thus, in the transistor device according to FIG. 2, at least one of the gate runners 31 is implemented such that a resistivity per area of the gate runner 31 increases in the longitudinal direction as a distance to the gate pad 32 along the gate runner 31 increases.

The resistivity per area of the gate runner 31 at a certain position of the gate runner 31 is given by the resistivity of the gate runner at the certain position divided by a cross sectional area of the gate runner 31 in a section plane parallel to the cross direction (that is, perpendicular to the longitudinal direction) of the gate runner 31. The gate runner may homogenously be formed from one gate runner material at the certain position. In this case, the resistivity per area at a certain position x in the longitudinal direction RPA(x) is given by the resistivity ρ(x) at this position divided by the cross sectional area A(x) at this position, that is, $$RPA(x) = \frac{\rho(x)}{A(x)} \quad (1a)$$

According to another example, the gate runner 31 includes two or more conducting layers with different resistivities. In this case, the resistivity per area at a certain position x is given by $$RPA(x) = \frac{1}{\sum_{i=1}^{k} \frac{A_i(x)}{\rho_i(x)}}, \quad (1b)$$

where k denotes the number of different layers, $A_i$ denotes the cross sectional area of a respective layer and $\rho_i(x)$ denotes the resistivity of the respective layer. The resistivity (which may also be referred to as specific resistance) per area at a certain position is equivalent to a resistance per unit length of the gate runner at the certain position.

Implementing at least one of the gate runners 31 such that the resistivity per area (RPA) increases in the longitudinal direction, a delay time between the time instance when a first one of the transistor cells connected to the gate runner 31 switches on and the time instance when a last one of the transistor cells connected to the gate runner 31 switches on can be significantly increased, even when the gate-source capacitances are rather low, so as to obtain a soft switching behavior of the transistor device.

In the following, $RPA_{MAX}$ denotes a maximum resistivity per area of the gate runner 31 and $RPA_{MIN}$ denotes a minimum resistivity per area of the gate runner 31. According to one example, a variation of the resistivity per area in the longitudinal direction is such that a ratio $RPA_{MAX}/RPA_{MIN}$ between the maximum and the minimum resistivity per area is at least 1.5, at least 2, at least 5, or at least 10.

The RPA of the gate runner 31 may vary in various ways. Some examples are illustrated in FIGS. 4A to 4E, wherein each of these figures illustrates the RPA along the longitudinal direction of the gate runner 31 between a first position x0 and a second position x1. Referring to FIG. 2, the first position x0 is a position closest to the gate pad 31 and the second position x1 is a position most distant to the gate pad 32. In the following, the first position x0 is also referred to as beginning of the gate runner 31 and the second position x0 is also referred to as end of the gate runner 31.

Figure 4A:
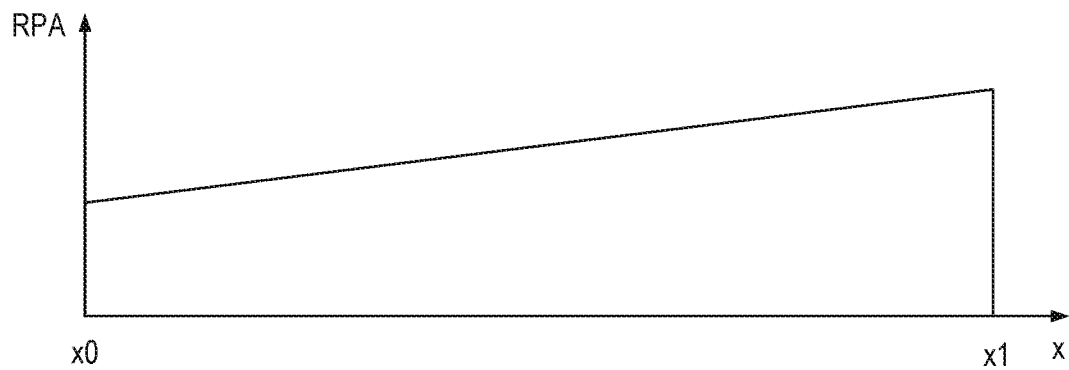
FIGS. 4A to 4E illustrate different examples of resistivity per area profiles of at least one gate runner.

Referring to FIG. 4A, the RPA may continuously increase between the beginning x0 of the gate runner and the end x1 of the gate runner. In this case, the gate runner has the minimum resistivity per area $RPA_{MIN}$ at the beginning and the maximum resistivity per area $RPA_{MAX}$ at the end of the gate runner 31.

Figure 4B:
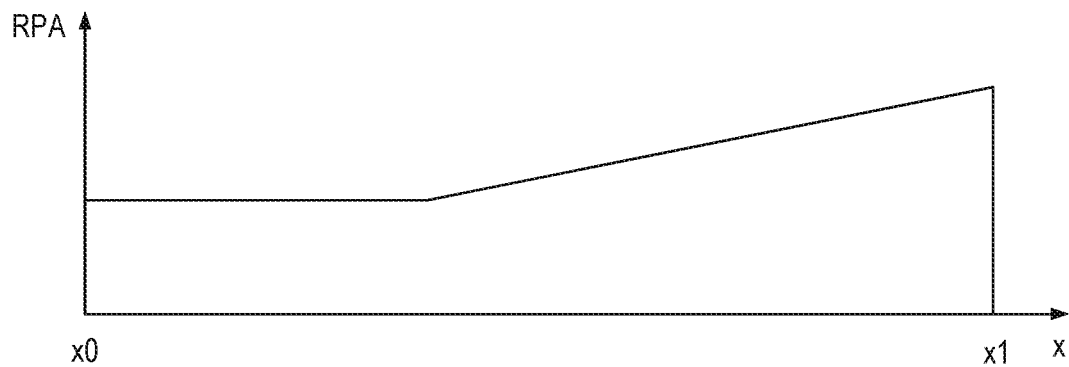
Figure 4C:
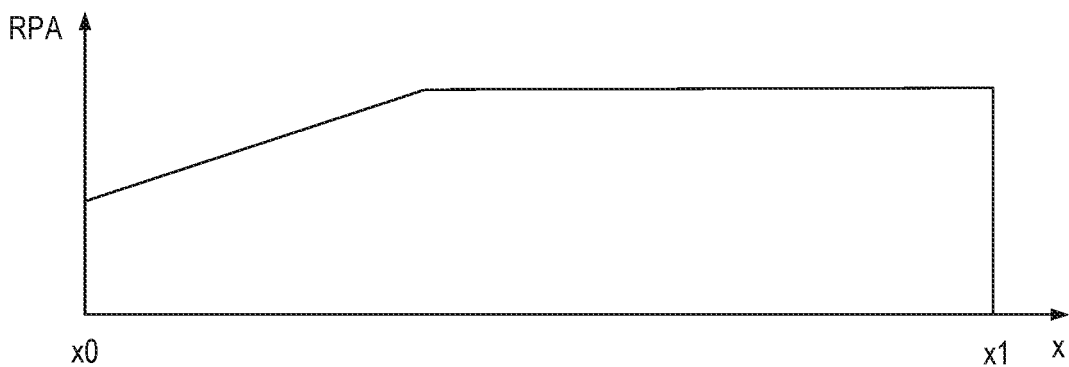

According to further examples illustrated in FIGS. 4B and 4C, the gate runner may include a section in which the RPA is essentially constant and another section in which the RPA continuously increases. Essentially constant, as used herein, may correspond to constant (such as where a difference in a characteristic (e.g., RPA) between different parts of a section is zero) or about constant (such as where a difference in a characteristic between different parts of a section is less than a threshold difference). In the example shown in FIG. 4B, the section with the constant RPA adjoins the beginning x0 of the gate runner 31. In the example shown in FIG. 4C, the section with the constant RPA adjoins the end of the gate runner 31.

Figure 4D:
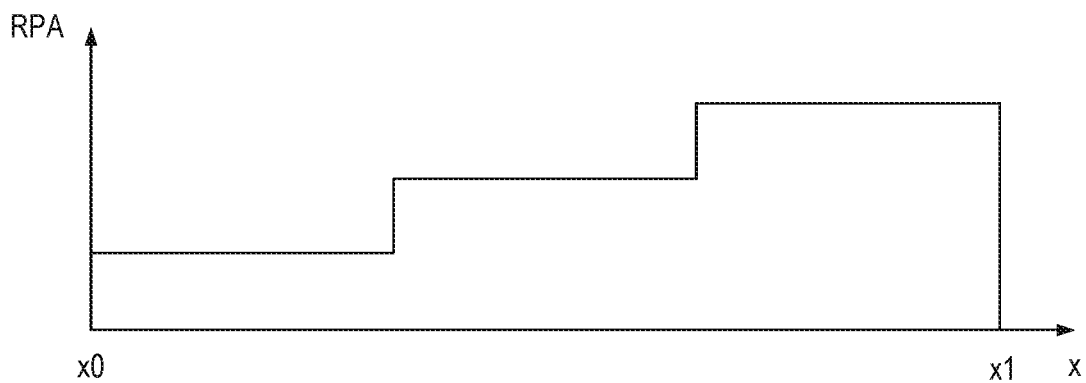

According to another example illustrated in FIG. 4D, the gate runner includes two or more sections in which the RPA is essentially constant. The RPA in the different sections is different such that the more distant a respective section is to the gate pad 42 the higher the respective RPA. In the example shown in FIG. 4D, the gate runner 31 includes three sections, wherein the RPA is essentially constant in each of these sections, but the RPA in the individual sections is different such that the RPA increases along the longitudinal direction. However, having three different sections is only an example. In some examples, the gate runner 31 may include any number of two or more of these gate runner sections.

Figure 4E:
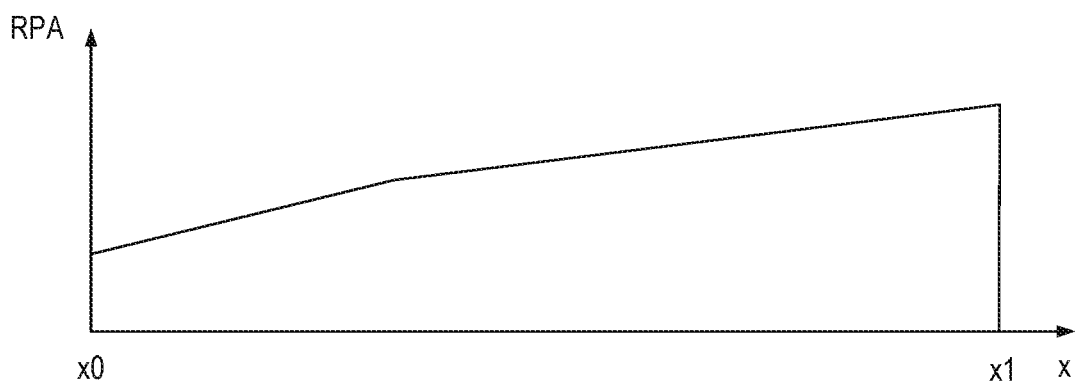

According to yet another example illustrated in FIG. 4E the gate runner 31 includes two or more sections in which the RPA continuously increases, wherein a slope of the increase is different in the individual sections.

In each of these examples the gate runner includes at least one section in which the RPA increases in the longitudinal direction as a distance to the beginning x0 of the gate runner increases.

Referring to the above, the RPA at a certain position of the gate runner 31 is dependent on the resistivity of the gate runner material at this position and the cross sectional area of the gate runner at this position. Thus, the RPA may be varied by varying the resistivity and/or the cross sectional area in the longitudinal direction.

Figure 5A:
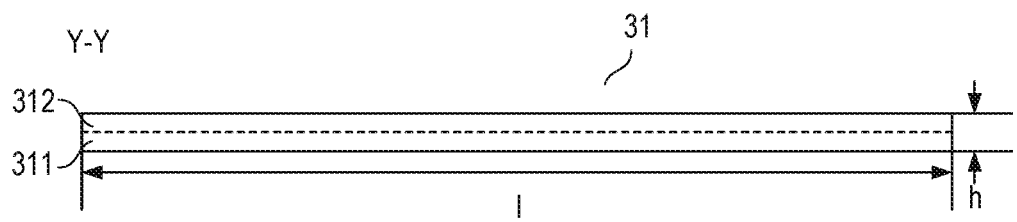
FIGS. 5A and 5B illustrate a vertical cross sectional view in a longitudinal direction and a vertical cross sectional view in a cross direction, respectively, of a gate runner according to one example.
Figure 5B:
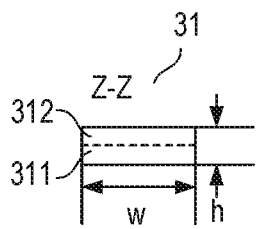

Examples of how the RPA may be varied by varying the cross sectional area of the gate runner 31 are explained with reference to FIGS. 5A and 5B and 6A to 6E. FIG. 5A illustrates a vertical cross sectional view of one example of a gate runner 31 in a first vertical section plane Y-Y that extends in the longitudinal direction x of the gate runner 31. FIG. 5B illustrates a vertical cross sectional view of the gate runner 31 in a second vertical section plane Z-Z that extends in the cross direction of the gate runner 31. Referring to FIGS. 5A and 5B, the gate runner 31 has a length l in the longitudinal direction, a width w in the cross direction, and a height h in a direction perpendicular to the longitudinal direction and the cross direction. The gate runner 31 may homogenously be comprised of one electrically conducting material such as any kind of metal or metal alloy. Examples of the metal include copper (Cu), aluminum (Al), tungsten (W), titanium (Ti), molybdenum (Mo) and examples of the metal alloy include any kind of alloy with two or more of Cu, Al, W, Mo or Ti. In some examples, as illustrated in dashed lines in FIGS. 5A and 5B, the gate runner 31 includes at least two material layers 311, 312 of different electrically conducting materials.

In a gate runner 31 of the type illustrated in FIGS. 5A and 5B, a variation of the RPA along the longitudinal direction can be achieved by varying the width w of the gate runner 31 along the longitudinal direction. Different examples of how the width w may be varied are illustrated in FIGS. 7A to 7E. Each of FIGS. 7A to 7E illustrates a top view of the gate runner 31 and the cross sectional area A of the respective gate runner 31 along the longitudinal direction x.

Figure 6A:
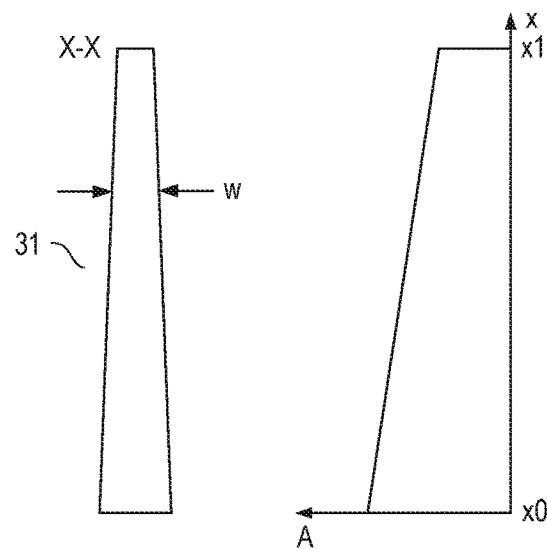
FIGS. 6A to 6E illustrate top views of a gate runner of the type illustrated in FIGS. 5A and 5B according to different examples.

In the example shown in FIG. 6A, the width w continuously decreases towards the end x1 of the gate runner 31, so that the cross sectional area A continuously decreases. The RPA of this gate runner 31 corresponds to the RPA illustrated in FIG. 4A.

Figure 6B:
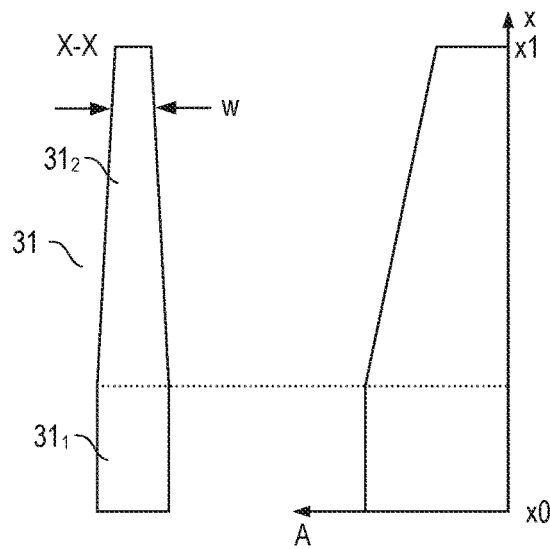

In the example shown in FIG. 6B, the gate runner 31 includes a first section $31_1$ in which the width w is essentially constant and a second section $31_2$ between the first section $31_1$ and the end x1 of the gate runner 31, wherein the width w in the second section $31_2$ continuously decreases. Thus, the cross sectional area A is essentially constant in the first section $31_1$ and continuously decreases towards the end x1 in the second section. The RPA of this gate runner 31 corresponds to the RPA illustrated in FIG. 4B.

Figure 6C:
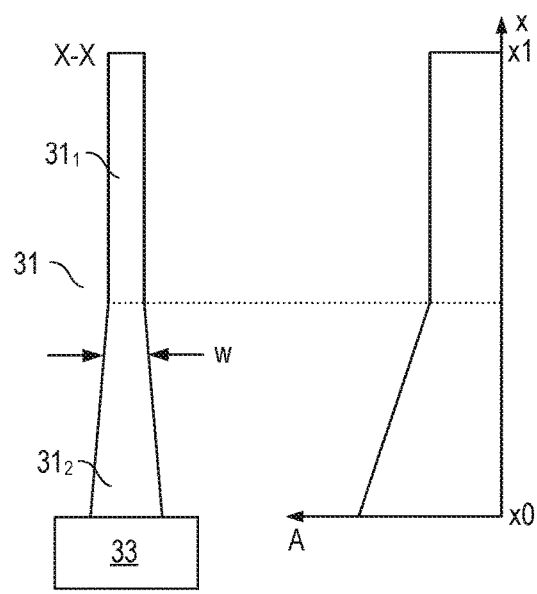

In the gate runner 31 shown in FIG. 6C, a second section $31_2$ with a continuously decreasing width adjoins the beginning x0 of the gate runner 31, while a first section $31_1$ with an essentially constant width is arranged between the second section $31_2$ and the end x1. The RPA of this gate runner 31 corresponds to the RPA illustrated in FIG. 4C.

Figure 6D:
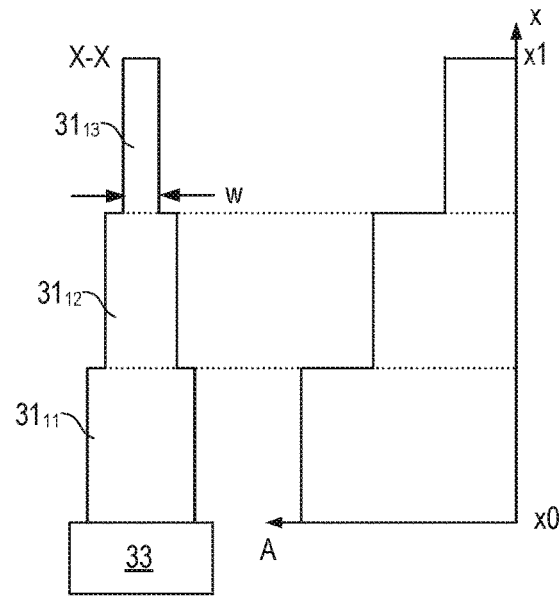

In the example shown in FIG. 6D, the gate runner 31 includes three sections $31_{11}$, $31_{12}$, $31_{13}$, wherein the width in each of these sections is essentially constant, but the width decreases towards the end x1 of the gate runner 31. The RPA of this type runner 31 corresponds to the RPA illustrated in FIG. 4D.

Figure 6E:
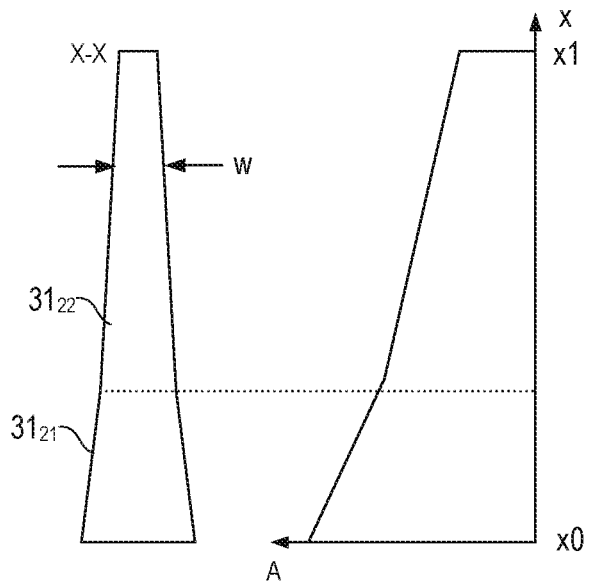

In the example shown in FIG. 6E, the gate runner 31 includes two different sections $31_{21}$, $31_{22}$ in which the width w decreases differently. The RPA of this type of gate runner 31 corresponds to the RPA illustrated in FIG. 4E.

Figure 7A:
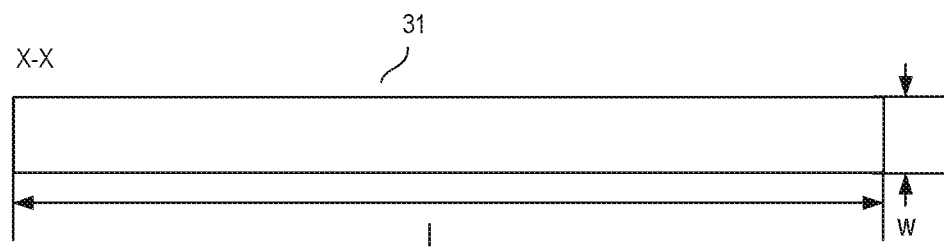
FIGS. 7A and 7B illustrate a top view and a vertical cross sectional view in a cross direction, respectively, of a gate runner according to one example.
Figure 7B:
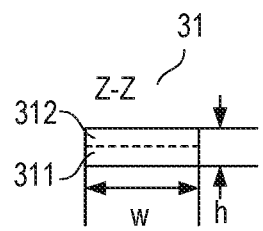
Figure 8A:
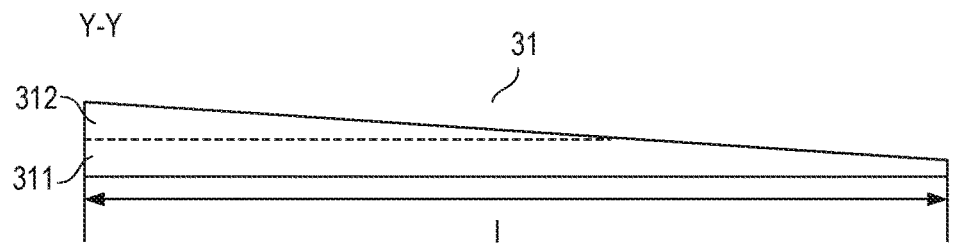
FIGS. 8A to 8E illustrate vertical cross sectional views in a longitudinal direction of a gate runner of the type illustrated in FIGS. 7A and 7B according to different examples.
Figure 8B:
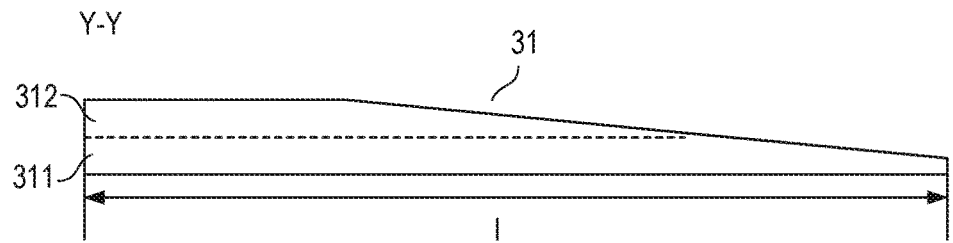
Figure 8C:
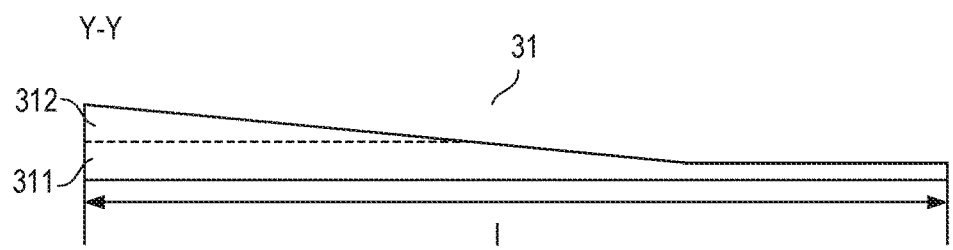
Figure 8D:
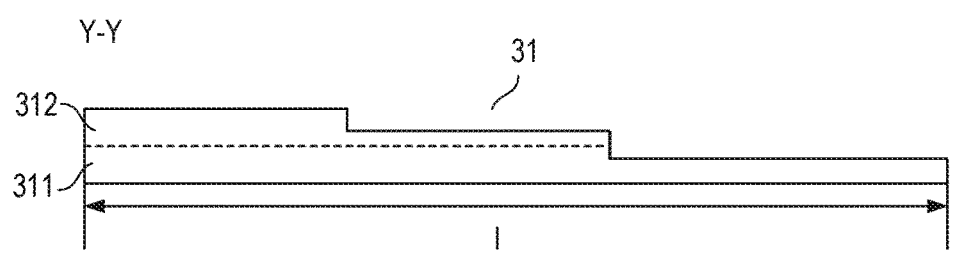
Figure 8E:
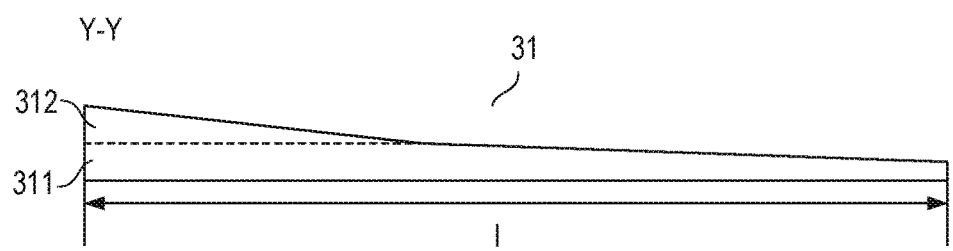

Another example of a gate runner 31 in which the RPA may be varied by varying the cross sectional area is illustrated in FIGS. 7A to 7B and 8A to 8E. FIG. 7A shows a top view of the gate runner 31 and FIG. 7B shows a vertical cross sectional view in the second vertical sectional plane Z-Z. In this example, the width w of the gate runner 31 is essentially constant along the longitudinal direction x. Referring to FIGS. 8A to 8E, a variation of the cross sectional area A is achieved by varying the height h along the longitudinal direction x. The height h may be varied in the same way as the width in the examples illustrated in FIGS. 7A to 7E. That is, (a) the height h may continuously decrease, as illustrated in FIG. 8A; (b) the gate runner 31 may include one section in which the height is essentially constant and another section in which the height continuously decreases, as illustrated in FIGS. 8B and 8C; (c) the height may decrease in one or more steps, as illustrated in FIG. 8D; or (d) the gate runner 31 may include two or more sections in which the height continuously decreases, as illustrated in FIG. 8E. The gate runner illustrated in FIGS. 7A to 7B and 8A to 8E may homogenously be comprised of one electrically conducting material. According to another example, the gate runner may include two or more electrically conducting layers 311, 312 with different resistivities.

Figure 9A:
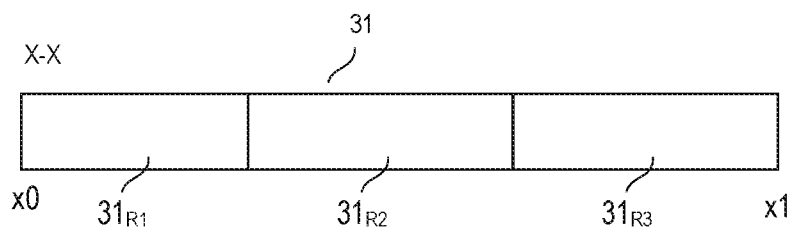
FIGS. 9A to 9C illustrate a top view, a vertical cross sectional view in a cross direction and a vertical cross sectional view in a longitudinal direction, respectively, of a gate runner according to another example.
Figure 9B:
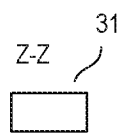
Figure 9C:
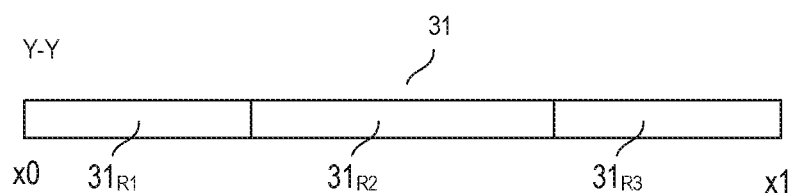

FIGS. 9A to 9C illustrate a gate runner 31 according to another example. More specifically, FIG. 9A shows a top view, FIG. 9B shows a vertical cross sectional view in the second section plane Z-Z and FIG. 9C shows a vertical cross sectional view in the first section plane Y-Y of the gate runner 31. In this example, the cross sectional area A of the gate runner 31 is essentially constant along the longitudinal direction x. A variation of the RPA is achieved by implementing the gate runner 31 such that the gate runner 31 includes two or more sections $31_{R1}$, $31_{R2}$, $31_{R3}$ with different resistivities. For the purpose of illustration, the gate runner 31 includes three sections with different resistivities in the example shown in FIGS. 9A to 9C. According to one example, a first section $31_{R1}$ at the beginning x0 of the gate runner 31 has the lowest resistivity, a second section $31_{R2}$ adjoining the first section $31_{R1}$ has a second resistivity higher than the first resistivity, and a third section $31_{R3}$ adjoining the second section $31_{R2}$ has a third resistivity higher than the second resistivity. The RPA of this gate runner 31 in the longitudinal direction corresponds to the RPA illustrated in FIG. 4D. It should be noted that implementing the gate runner 31 with three sections $31_{R1}$-$31_{R3}$ having different resistivities is only an example. In some examples, the gate runner 31 includes at least two sections with different resistivities.

It goes without saying that varying the cross sectional area and the resistivity may be combined. That is, the transistor device may be implemented such that in at least one section of the gate runner 31 the resistivity increases and the cross sectional area decreases.

The transistor cells 10 of the transistor device may be implemented in various ways. Some examples are explained in the following.

Figure 10:
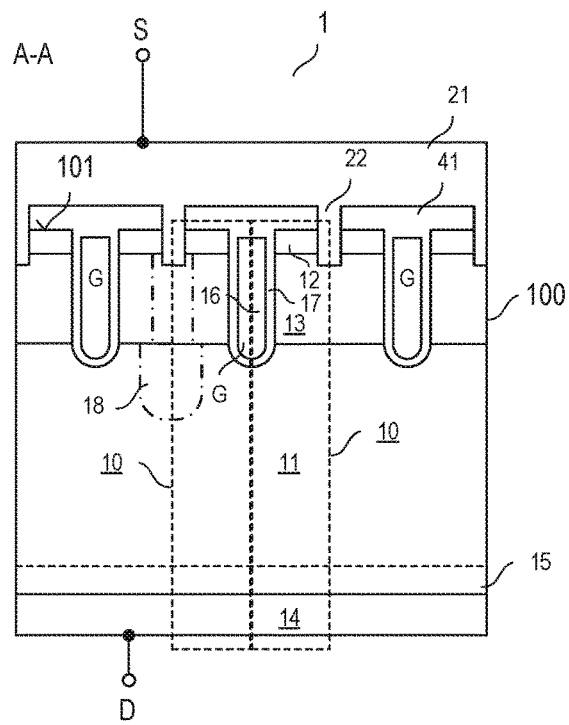
FIG. 10 illustrates a vertical cross sectional view of a transistor device according to one example.

FIG. 10 illustrates a vertical cross sectional view of the semiconductor body 100 in a section plane A-A shown in FIG. 2, wherein this section plane A-A cuts through several transistor cells 10 of the transistor device. Referring to FIG. 10, each of the transistor cells 10 includes a drift region 11, a source region 12 and a body region 13 arranged between the drift region 11 and the source region 12. The gate electrode 16 of each transistor cell 10 is dielectrically insulated from the body region 13 by a gate dielectric 17. Each transistor cell 10 further includes a drain region 14 that is separated from the body region 13 by the drift region 11. In some examples, a field-stop region 15 is arranged between the drain region 14 and the drift region 11.

The transistor cells 10 are vertical transistor cells in the example shown in FIG. 10. That is, the source region 12 and the drain region 14 of each transistor cell 10 are spaced apart from each other in a vertical direction of the semiconductor body 100. The "vertical direction" is a direction perpendicular to a first surface 101, wherein the "first surface" 101 is the surface on top of which the gate pad 31 (not shown in FIG. 10) and the gate runners 31 (also not shown in FIG. 10) are arranged.

The semiconductor body 100 includes a monocrystalline wide bandgap semiconductor material so that the source region 12, the body region 13, the drift region 11, the drain region 14 and the optional field-stop region 15 of each transistor cell 10 are monocrystalline semiconductor regions. A "wide bandgap semiconductor material" is a semiconductor material having a bandgap higher than 2.3 eV. Examples of the semiconductor material of the semiconductor body 100 include, but are not restricted to, silicon carbide (SiC), gallium nitride (GaN), or the like. The gate electrode 16 includes an electrically conducting material such as a metal or a polycrystalline semiconductor material, such as polysilicon.

The semiconductor body 100 may partially or completely be comprised of a wide bandgap semiconductor material. In some examples, only those sections of the semiconductor body that include active device regions, such as source, body, drift, and drain regions are comprised of a wide bandgap semiconductor material.

Referring to FIG. 10, the drain regions 14 of the transistor cells 10 may be formed by one continuous semiconductor region, and the drift regions 11 of the transistor cells 10 may be formed by one continuous semiconductor region. Further, the gate electrodes 16 of two transistor cells 10 may be formed by one electrode, and the body regions 13 of two (other) transistor cells 10 may be formed by one semiconductor region.

The drain region 14 forms the drain node D or is connected to the drain node D of the transistor device 1. Further, the source regions 12 of the transistor cells 10 and the body regions 13 of the transistor cells 10 are connected to the source node S of the transistor device. According to one example, a source electrode 21 formed on top of the first surface 101 forms the source node S or is connected to the source node S of the transistor device 1, wherein the source electrode 21 is electrically connected to the source and body regions 12, 13 of the individual transistor cells 10. Referring to FIG. 10, an insulation layer 41 may be formed on top of the first surface 101, the source electrode 21 may be formed on top of the insulation layer 41, and the source and body regions 12, 13 may be connected to the source electrode 21 through electrically conducting vias 22 that extend from the source electrode 21 through the insulation layer 41 to the source and body regions 12, 13.

The gate electrodes 16 are connected to the gate node G. This is only schematically illustrated in FIG. 10. Connections between the gate electrodes 16 and the gate node G via the gate runners 31 are not illustrated in FIG. 10 and will be explained herein further below.

In the example shown in FIG. 10, the transistor cells 10 are trench transistor cells. That is, the gate electrode 16 of each transistor cell 10 is arranged in a trench that extends from the first surface 101 into the semiconductor body. This, however, is only an example. According to another example (not shown) the transistor cells are planar transistor cells. In this case, the gate electrode is arranged above the first surface 101 of the semiconductor body 100.

The gate-source capacitance of each transistor cell 10 is the capacitance between the gate electrode 16 and the source region 12. This capacitance, inter alia, is dependent on a thickness and a material of the gate dielectric 17 and is dependent on how much the gate electrode 16 and the source region 12 overlap. The threshold voltage of the transistor cell 10 is, inter alia, dependent on a doping concentration of the body region 13.

Referring to the above, the transistor device 1 may be implemented as an n-type transistor device or a p-type transistor device. In an n-type transistor device, the source region 12 and the drift region 11 are n-doped and the body region 13 is p-doped. In a p-type transistor device, the source region 12 and the drift region 11 are p-doped and the body region 13 is n-doped. Further, the transistor device can be implemented as an enhancement device or as a depletion device. In an enhancement device, the body region 13 adjoins the gate dielectric 17 (as illustrated in FIG. 8B). In a depletion device, the transistor cell 10 additionally includes a channel region (not shown) of the same doping type as the source region 12 and the drift region 11, wherein this channel region extends along the gate dielectric 17 between the source region 12 and the drift region 11. The transistor device may be implemented as a MOSFET so that the drain region 14 has the same doping type as the source region 12 and the drift region 11.

In the example shown in FIG. 10, two transistor cells 10 share one gate electrode. That is, the gate electrodes of these transistor cells are formed by one electrode. Consequently, source regions 12 of two transistor cells 10 adjoin sidewalls of the trench accommodating the gate electrode 16 on both sides. This, however, is only an example.

Figure 11:
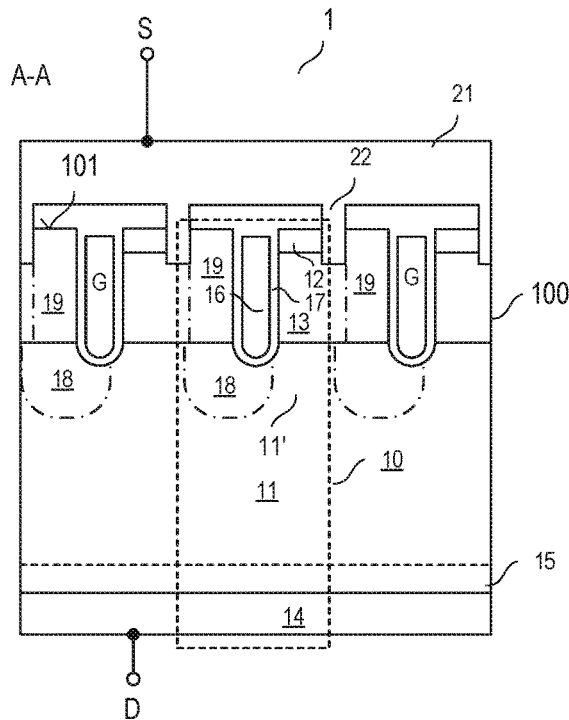

According to another example illustrated in FIG. 11, the source region 12 of a transistor cell 10 adjoins the gate trench on one side, and the body region 13 of a neighboring transistor cell adjoins the gate trench on an opposite side. In this example, neighboring transistor cell 10 have separate gate electrodes.

In some examples, in the transistor device shown in FIG. 11, at least some of the transistor cells 10 include a junction region 18 of the same doping type as the body region 13. This junction region 18 (a) is arranged below the body region 13, (b) is at least partially arranged below the gate electrode 16 and the gate dielectric 17, (c) may adjoin the gate dielectric 17, (d) adjoins the drift region 11, and (e) is connected to the source electrode 21. The junction region 18 may be connected to the source electrode 21 via the body region 13 or via a connection region 19 of the same doping type as the body region 13, wherein the connection region 19 may have a doping concentration that is higher than a doping concentration of the body region 13. In case the junction region 18 is connected to the source electrode 21 through the connection region 19, the junction region 18 may be spaced apart from the body region 12 in a vertical direction of the semiconductor body 100, which is a direction perpendicular to the first surface 101.

In the transistor device shown in FIG. 11, junction regions 18 of neighboring transistor cells and sections 11' of the drift region 11 arranged between junction regions 18 of neighboring transistor cells 10 form a JFET (Function Field-Effect Transistor). The sections 11' of the drift region 11 arranged between junction regions 18 of neighboring transistor cells 10 are referred to as channel sections in the following. When the transistor device switches off, so that a potential in the drift region 11 increases, depletion regions expand in the channel sections 11' beginning at pn-junctions between the junction regions 18 and the channel sections 11'. As the voltage between the drain node D and the source node S increases, the channel sections 11' are depleted (e.g., completely depleted) of charge carriers. The electrical potential of the junction region 18 and the depleted channel sections 11' is close to the electrical potential at the source node S (e.g., a difference between the electrical potential of the junction region 18 and the electrical potential of the depleted channel sections 11' is less than a threshold difference). In this way, high voltages (e.g., voltages higher than a threshold voltage) across the gate dielectrics 17 can be avoided. In some examples, in the off-state of the transistor device, the electrical potential of the gate electrodes 16 is close to the electrical potential at the source node S (e.g., a difference between the electrical potential of the gate electrodes 16 and the electrical potential at the source node S is less than a threshold difference).

In the example illustrated in FIG. 11, each of the transistor cells includes a junction region 18 and an optional connection region 19. This, however, is only an example. According to another example (not illustrated) only some of the transistor cells 10, such as every second or every third transistor cell 10, includes a junction region 18 and an optional connection region.

Implementing the transistor device with junction regions 18 is not restricted to an implementation of the type shown in FIG. 11 in which each gate electrode 16 is exclusively associated with one transistor cell 10, so that the source region 12 of a transistor cell 10 adjoins the gate trench on one side, and the body region 13 of a neighboring transistor cell adjoins the gate trench on an opposite side. Junction regions 18 may also be implemented in a transistor device of the type shown in FIG. 10, wherein, for the purpose of illustration, only one junction region 18 is illustrated in FIG. 10. In this example, each junction region 18, in the vertical direction, is located below a respective body region 13 and, in a horizontal direction, is located between neighboring gate trenches and spaced apart from the respective gate dielectrics 17. In some examples, the junction region 18 is connected to the source electrode 21 through a connection region 19 of the type explained with reference to FIG. 11. In this case, the junction region 18 may adjoin the body region 13 or may be spaced apart from the body region 13 in the vertical direction.

Figure 12A:
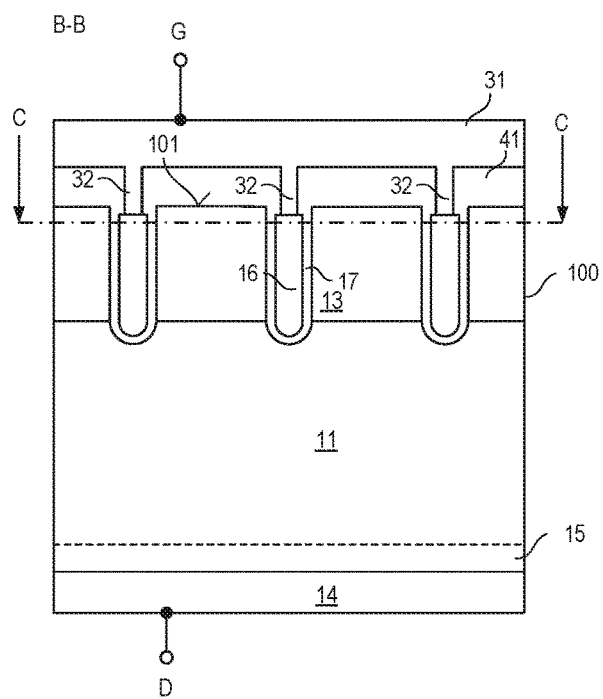
FIGS. 12A and 12B illustrate a vertical cross sectional view and a horizontal cross sectional view, respectively, of the transistor device according to FIG. 10.
Figure 12B:
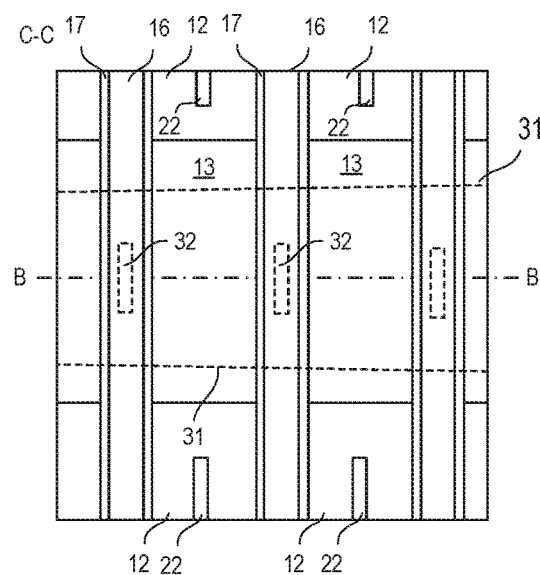

FIG. 12A illustrates a vertical cross sectional view of the semiconductor body 100 in a further section plane B-B. This section plane cuts through several transistor cells and the gate runner 31, so that FIG. 12A illustrates how the gate electrodes 16 of the transistor cells may be connected to the gate runner 31. FIG. 12B shows a horizontal cross sectional view of the semiconductor body 100 in a section plane C-C illustrated in FIG. 12A. Referring to FIG. 12A, the gate runner 31 is arranged on top of the insulation layer 41 and is connected to the gate electrodes 16 through electrically conducting vias 32 that extend from the gate runner 31 through the insulation layer 41 to the gate electrodes 16. Referring to FIG. 12B, the source regions 12 may be omitted below the gate runner 31. Thus, the transistor cells 10 are spaced apart from the positions at which the gate runner 31 is connected to the gate electrodes 16, wherein the gate electrodes 16 extend beyond the transistor cells 10 to the region below the gate runner 31.

In this example, the gate electrodes 16 may be implemented as elongated gate electrodes, wherein a longitudinal direction of these elongated gate electrodes 16 may be perpendicular to the longitudinal directions of the gate runners 31. In this example, the gate electrodes of several transistor cells 10 that are spaced apart from each other along the longitudinal directions of the gate electrodes 16 may be formed by one elongated electrode. In this way, one trench electrode forming the gate electrodes of several transistor cells 10 may be connected to several gate runners 31. The trench electrodes forming the gate electrodes 16, have an electrical resistance. Thus, it can be assumed that switching on or switching off of a particular transistor cell 10 is governed by the one of the gate runners 31 that is arranged closest to the respective transistor cell 10. That is, a transistor cell arrangement with a gate electrode 16, a body region 13 and an source region 12 arranged between two gate runner vias 32 may be considered as two transistor cells, a first transistor cell that includes those sections of the arrangement that are located closer to a first one of the gate runner vias 32, and a second transistor cell that includes those sections of the arrangement that are located closer to a second one of the gate runner vias 32. The gate runner 31 connected to the first gate runner via governs switching on or switching off the first transistor cell, and the gate runner 31 connected to the second gate runner via governs switching on or switching off the second transistor cell.

The source electrode 21, which is not illustrated in the top view shown in FIG. 2, may be implemented in various ways. According to one example, the gate runners 31 are implemented in a first metallization layer (e.g., metallization plane) and the source electrode 21 is arranged in a second metallization layer (e.g., metallization plane) above the gate runners 31, wherein the source electrode 21 is electrically insulated from the gate runners 31. In this case, the source electrode 21 may be formed as one electrode that covers the gate runners 31, wherein this one electrode is connected to the source node S or forms the source node S of the transistor device.

According to another example, the gate runners 31 are implemented in a first metallization layer (e.g., metallization plane) and the source electrode 21 includes several electrode sections that are also implemented in the first metallization layer and spaced apart from the gate runners 31. These electrode sections are connected to the source node S via bond wires, clips, or the like.

Figure 13:
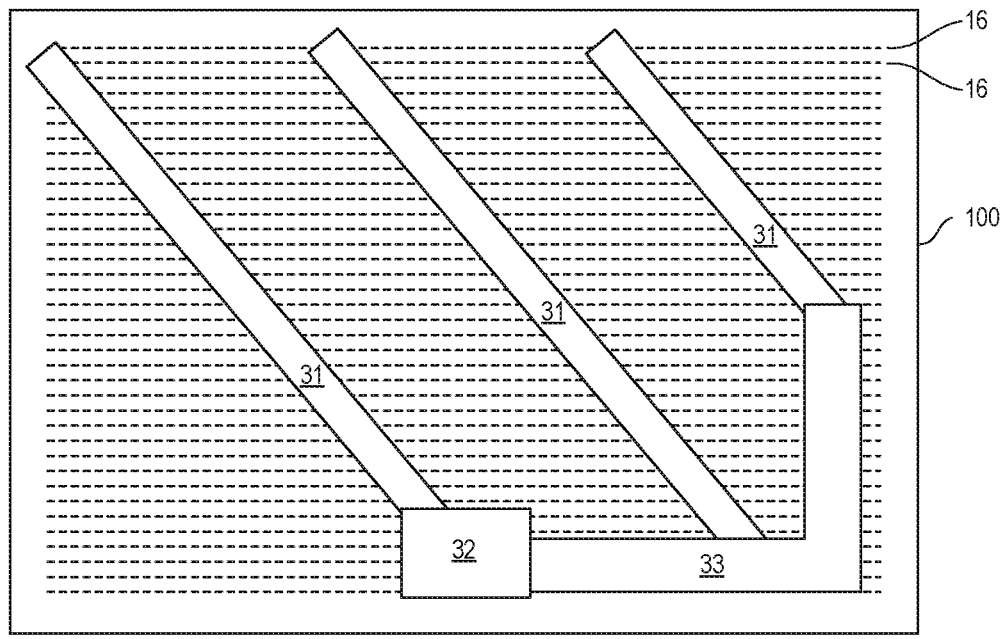
FIG. 13 shows a top view of a transistor device according to another example.

FIG. 13 illustrates a top view of a transistor device with a soft switching behavior according to another example. This transistor device is based on the transistor device shown in FIG. 2 and is different from the transistor device shown in FIG. 2 in that an angle between longitudinal directions of the gate runners 31 and longitudinal directions of the gate electrodes 16 is different from 90° and is between 30° and 60°, for example. One or more of the gate runners 31 may be implemented in accordance with one of the examples explained above, that is, such that a gate runner 31 includes at least one section in which the resistivity per area increase along the longitudinal direction. This, however, is only an example. According to another example, the resistivity per area of the gate runners is essentially constant along the longitudinal direction. In this example, the transistor device includes gate electrode sections that are spaced apart farther from a gate runner 31 than most of the other gate electrode sections so that transistor cells associated with these gate electrode sections change their respective switching state slower than transistor cells associated with the other gate electrode sections. Thus, a soft switching behavior is achieved.

Referring to the above, a soft switching behavior may be obtained when transistor cells 10 switch on or off at different time instances, wherein the time instances when transistor cells switch on or off may be adjusted by adjusting a resistance between gate electrodes 16 of the transistor cells 10 and the gate node G (e.g., the time instances may be adjusted and/or set by setting the resistance to a suitable resistance). Referring to the above, the elongated gate electrodes 16 are comprised of an electrically conducting material, such as a doped polysilicon or a metal, and have an electrical resistance. Referring to above, a transistor cell switches on or off dependent on a voltage between the gate electrode 16 and the source region 12, wherein, in the on-state of the transistor cell 10, there is a conducting channel in the body region 13 along the gate dielectric 17 and, in the off-state of the transistor cell 10, the conducting channel is interrupted. Due to the resistance of the gate electrode 16, the conducting channel does not form (or is not interrupted) at the same time at each position along the gate electrode 16 of one transistor cell when the gate-source voltage is received by the transistor cell 10. Instead, when the electrical potential of the electrically conducting via 32 that connects a gate runner 31 to a respective transistor cell 10 changes, the operating state (e.g., on-state or off-state) of the transistor cell 10 first changes at positions close to the via 32, and the change of the operating state "propagates" (e.g., from the positions close to the via 32) to positions more distant to the via 32. In this way, there is also a switching delay in each of the transistor cells 10.

Figure 14:
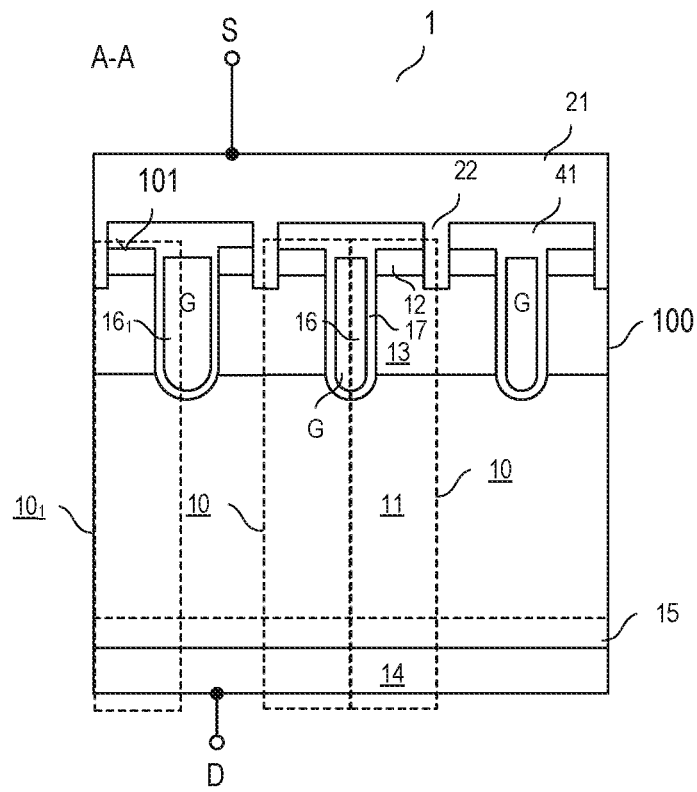
FIG. 14 illustrates a vertical cross sectional view of a transistor device according to one example.

According to one example, a soft switching behavior is achieved by implementing the gate electrodes 16 of different transistor cells 10 with different resistivities. This may be achieved by implementing the gate electrodes 16 of some transistor cells 10 with a larger cross sectional area than the gate electrodes of other transistor cells. One example of a transistor device of this type is shown in FIG. 14, wherein FIG. 14 shows a vertical cross sectional view of a transistor device 1. This transistor device is based on the transistor device shown in FIG. 10 and is different from the transistor device shown in FIG. 10 in that it includes at least one transistor cell $10_1$ that has a gate electrode $16_1$ with a larger cross sectional area than the gate electrodes 16 of other transistor cells.

One or more of the gate runners 31 (not shown) of the transistor device shown in FIG. 14 may be implemented in accordance with one of the examples explained above, that is, such that a gate runner 31 includes at least one section in which the resistivity per area increases along the longitudinal direction. This, however, is only an example. According to another example, the resistivity per area of the gate runners is essentially constant along the longitudinal direction.

Figure 15:
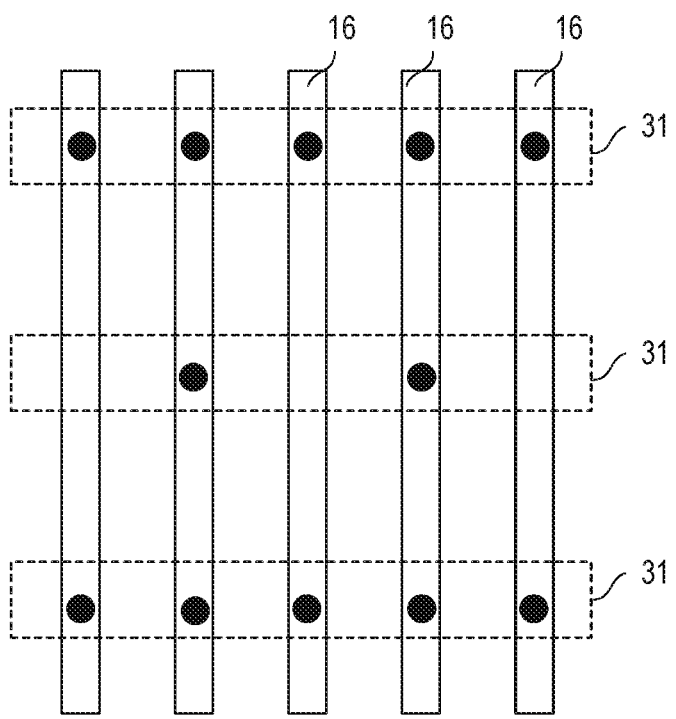
FIG. 15 illustrates a top view of a section of a transistor device according to another example.

Another way to achieve a soft switching behavior is illustrated in FIG. 15, which schematically illustrates a top view of one section of a transistor device. More specifically, FIG. 15 illustrates a top view of several gate electrodes 16 and several gate runners 31 crossing the gate electrodes 16. The black dots in FIG. 15 represent connections between the gate runners 31 and the gate electrodes 16. A gate electrode 16 can be connected to a gate runner 31 at each position at which the gate runner 31 crosses the gate electrode 16. In the example shown in FIG. 15, some connections are omitted, so that some of the transistor cells are not connected to the closest gate runner, but are connected to a gate runner farther away than the closest gate runner through the trench electrode forming the gate electrodes 16. In this way, some of the transistor cells have a larger switching delay than others of the transistor cells, so that a soft switching behavior is achieved.

One or more of the gate runners 31 (not shown) of the transistor device shown in FIG. 15 may be implemented in accordance with one of the examples explained above, that is, such that a gate runner 31 includes at least one section in which the resistivity per area increases along the longitudinal direction. This, however, is only an example. According to another example, the resistivity per area of the gate runners is essentially constant along the longitudinal direction.

Although the examples explained above relate to MOSFETs this is only an example. The concepts explained herein for achieving a soft switching behavior may be applied to any other kind of transistor device such as a GaN based HEMT (High Electron-Mobility Transistor), or a JFET as well. A JFET is different from a MOSFET in that it includes doped base regions of a doping type complementary to the doping type of the drift region instead of the gate electrodes 16 and gate dielectrics 17 and the body regions 13. The base regions adjoin the drift region and are connected to the gate runners in the same way as the gate electrodes explained above.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

The invention claimed is:

1. A transistor device, comprising:
   a plurality of transistor cells, wherein each transistor cell of the plurality of transistor cells comprises a gate electrode and each transistor cell of the plurality of transistor cells is at least partially integrated in a semiconductor body that comprises a wide bandgap semiconductor material;
   a gate pad arranged on top of the semiconductor body; and
   a plurality of gate runners, wherein each gate runner of the plurality of gate runners is arranged on top of the semiconductor body and each gate runner of the plurality of gate runners is connected to gate electrodes of at least some of the plurality of transistor cells, wherein:
   each gate runner of the plurality of gate runners extends in a longitudinal direction, and
   at least one gate runner of the plurality of gate runners comprises at least a section in which a resistivity per area increases in the longitudinal direction as a distance to the gate pad along the gate runner increases.

2. The transistor device of claim 1,
   wherein each gate runner of the plurality of gate runners comprises at least a section in which a resistivity per area increases in the longitudinal direction as a distance to the gate pad along the gate runner increases.

3. The transistor device of claim 2,
   wherein gate runners of the plurality of gate runners are essentially parallel to each other.

4. The transistor device of claim 1,
   wherein the at least a section in which the resistivity per area increases is implemented such that a cross sectional area of the at least a section decreases in the longitudinal direction.

5. The transistor device of claim 4,
   wherein the at least a section comprises an essentially constant height and wherein a width of the at least a section decreases in the longitudinal direction.

6. The transistor device of claim 4,
   wherein the at least a section comprises an essentially constant width and wherein a height of the at least a section decreases in the longitudinal direction.

7. The transistor device of claim 1,
   wherein the at least a section in which the resistivity per area increases is implemented such that a resistivity of the at least one gate runner increases in the longitudinal direction.

8. The transistor device of claim 1,
   wherein a ratio between a maximum resistivity per area and a minimum resistivity per area of the at least one gate runner is at least 2.

9. The transistor device of claim 1, comprising:
   at least one connection runner connected between the gate pad and at least some of the plurality of gate runners.

10. The transistor device of claim 1,
    wherein each transistor cell of the plurality of transistor cells comprises:
    a drift region, a source region, and a body region, wherein the body region is arranged between the source region and the drift region and the body region is dielectrically insulated from the gate electrode by a gate dielectric.

11. The transistor device of claim 1,
    wherein gate electrodes of one or more transistor cells of the plurality of transistor cells are formed by a respective elongated trench electrode of a plurality of elongated trench electrodes.

12. The transistor device of claim 11,
    wherein elongated trench electrodes of the plurality of elongated trench electrodes are essentially perpendicular to gate runners of the plurality of gate runners.

13. The transistor device of claim 11,
    wherein angles between elongated trench electrodes of the plurality of elongated trench electrodes and gate runners of the plurality of gate runners are between 30° and 60°.

14. The transistor device of claim 11,
    wherein each gate runner of the plurality of gate runners crosses elongated trench electrodes of the plurality of elongated trench electrodes, and
    wherein each gate runner of the plurality of gate runners is connected to each elongated trench electrode that the gate runner crosses.

15. The transistor device of claim 11,
    wherein each gate runner of the plurality of gate runners crosses elongated trench electrodes of the plurality of elongated trench electrodes, and
    wherein each gate runner of the plurality of gate runners is connected to less than every elongated trench electrode that the gate runner crosses.

16. The transistor device of claim 1, wherein the wide bandgap semiconductor material is silicon carbide.

17. A transistor device, comprising:
    a plurality of transistor cells, wherein each transistor cell of the plurality of transistor cells comprises a gate electrode and each transistor cell of the plurality of transistor cells is at least partially integrated in a semiconductor body that comprises a wide bandgap semiconductor material;
    a gate pad arranged on top of the semiconductor body; and
    a plurality of gate runners, wherein each gate runner of the plurality of gate runners is arranged on top of the semiconductor body and each gate runner of the plurality of gate runners is connected to gate electrodes of at least some of the plurality of transistor cells, wherein:
    each gate runner of the plurality of gate runners has a longitudinal direction,
    each gate runner of the plurality of gate runners comprises at least a section in which a resistivity per area increases in the longitudinal direction as a distance to the gate pad along the gate runner increases, and
    a ratio between a maximum resistivity per area and a minimum resistivity per area of a gate runner of the plurality of gate runners is at least 2.

18. The transistor device of claim 17, wherein the wide bandgap semiconductor material is silicon carbide.

19. A transistor device, comprising:
- a plurality of transistor cells, wherein each transistor cell of the plurality of transistor cells comprises a gate electrode and each transistor cell of the plurality of transistor cells is at least partially integrated in a semiconductor body that comprises a wide bandgap semiconductor material;
- a gate pad arranged on top of the semiconductor body;
- a plurality of gate runners, wherein each gate runner of the plurality of gate runners is arranged on top of the semiconductor body and each gate runner of the plurality of gate runners is connected to gate electrodes of at least some of the plurality of transistor cells, and
- at least one connection runner connected between the gate pad and at least some of the plurality of gate runners, wherein:
  - each gate runner of the plurality of gate runners extends in a longitudinal direction, and
  - each gate runner of the plurality of gate runners comprises at least a section in which a resistivity per area increases in the longitudinal direction as a distance to the gate pad along the gate runner increases.

20. The transistor device of claim 19, wherein the wide bandgap semiconductor material is silicon carbide.

* * * * *